United States Patent [19]

Howard

[11] Patent Number: 5,323,112
[45] Date of Patent: Jun. 21, 1994

[54] REPRODUCIBLY POSITIONABLE NMR PROBE

[75] Inventor: Layne E. Howard, San Jose, Calif.

[73] Assignee: Varian Associates, Inc., Palo Alto, Calif.

[21] Appl. No.: 26,936

[22] Filed: Mar. 5, 1993

[51] Int. Cl.⁵ .............................................. G01V 3/00
[52] U.S. Cl. .................................................. 324/318
[58] Field of Search ............... 324/318, 322, 320, 319, 324/322, 307; 248/662, 665, 666

[56] References Cited

U.S. PATENT DOCUMENTS

| | | | |
|---|---|---|---|
| 4,949,044 | 8/1990 | Starewicz et al. | 324/318 |
| 5,066,915 | 11/1991 | Omori et al. | 324/318 |
| 5,085,219 | 2/1992 | Ortendahl et al. | 324/318 |
| 5,136,244 | 8/1992 | Jones et al. | 324/318 |
| 5,181,430 | 1/1993 | Panin | 248/662 |

OTHER PUBLICATIONS

Various data sheet "Do VT CP/MAS with the Varian Spinning Advantage", published Jul. 1991.

Primary Examiner—Louis Arana
Attorney, Agent, or Firm—Edward H. Berkowitz

[57] ABSTRACT

An NMR probe includes a locking collar which is adapted to engage a magnet flange fixed to the NMR magnet. The probe can be removed and reinserted to the same location and orientation.

6 Claims, 2 Drawing Sheets

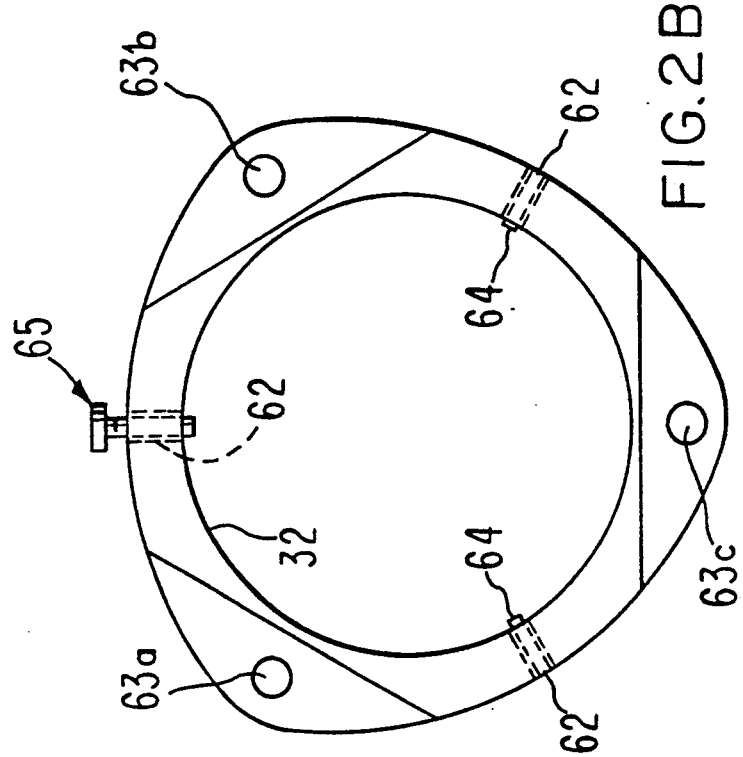
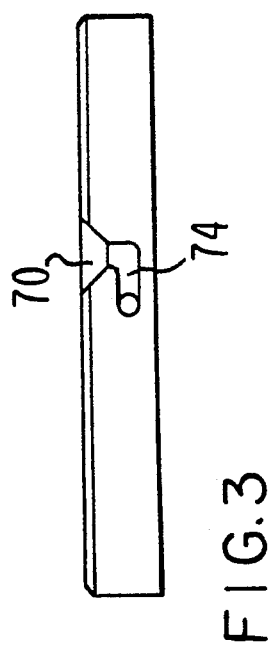
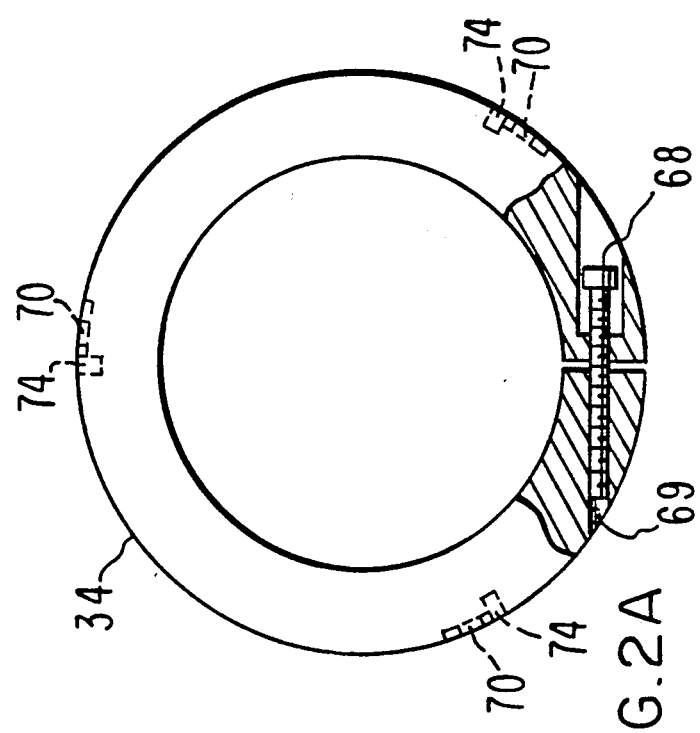

REPRODUCIBLY POSITIONABLE NMR PROBE

FIELD OF THE INVENTION

The invention is within the field of NMR apparatus and pertains particularly to precise positioning of an NMR probe in relationship to the sample and the NMR magnet.

BACKGROUND OF THE INVENTION

Modern NMR apparatus is most often characterized in gross by cylindrical symmetry. A typical NMR magnet is of the superconducting variety and is housed in a dewar which includes a room temperature cylindrical bore in which a very carefully controlled homogeneous magnetic field is sustained by operation of the superconducting magnet in the interior of the dewar. The NMR probe contains the excitation and detection interface to the sample and is mounted in a cylindrical housing for insertion in the bore.

The basic requirement of field uniformity is painstakingly achieved in a process of field shimming whereby irregularities of the resulting magnetic field are compensated. The NMR apparatus for certain application is capable of precision of the order of one part in $10^9$. Consequently many apparently minor effects are readily observable. For example, any object introduced into the sensitive volume portion of the magnet bore will disturb the magnetic field distribution if the object has a non zero magnetic susceptibility. Further shimming of the magnet may be required to compensate this disturbance. Consequently the NMR probe which is inserted into this region must be capable of reoccupying the exact region in the same orientation for which a careful shimming operation has previously been completed.

The NMR probe is designed to exhibit gross cylindrical symmetry, but the internal structure of the probe contains circuits, circuit elements, connectors, fluid supply tubes, mechanical mounting means for all of the above and the like. Thus the internal structure generally exhibits no geometric symmetry and the azimuthal orientation of the probe in the bore results in a particular distribution of probe components in the magnet bore. Moreover, these components may exhibit diverse magnetic susceptibility properties. It is therefore desirable to assure that the location and orientation of the probe is reproducible in NMR apparatus in order to avoid any requirement for additional shimming operations.

In the prior art it was common to obtain a reproducible positioning of the probe in the z coordinate (that is, the axis of the bore) by the straightforward step of providing a stop, or equivalent, against which the probe body could be urged. Other prior art provided for a pair (or triplet) of floating thumbscrews to secure a collar about the probe body to a flange of the magnet cryostat. In this arrangement the tolerance in azimuthal orientation is undesirable and the precision of reproducible angular position is lacking. In the present invention both the axial and azimuthal positioning is obtained in an arrangement which mechanically assures positive positioning reproducibility, or alternatively repositioning at selected angular increments of azimuthal angle from a known desired orientation.

In other prior art pertaining to magnetic resonance imaging, patient support mechanisms are employed for the purpose of transporting the subject to a known position in the magnetic field space, whereas the RF excitation and detection interface is not disturbed. In typical apparatus where the NMR probe is removable, the sample is independently supported.

A preferred arrangement of the present invention employs a bayonet pin mounting arrangement to secure the body of the probe to a mounting collar affixed to the magnet cryostat. Further to this embodiment, the pinning arrangement may be provided in selected symmetry to permit selected known discrete angular positioning which is useful for samples which are cylindrically asymmetric.

BRIEF DESCRIPTION OF THE FIGURES

FIG. 2A shows a locking collar of the present invention.

FIG. 2B shows a magnet flange for use with the locking collar.

FIG. 3 is a side view of the locking collar of FIG. 2A.

DETAILED DESCRIPTION OF THE PREFERRED EMBODIMENT

Figure 1:
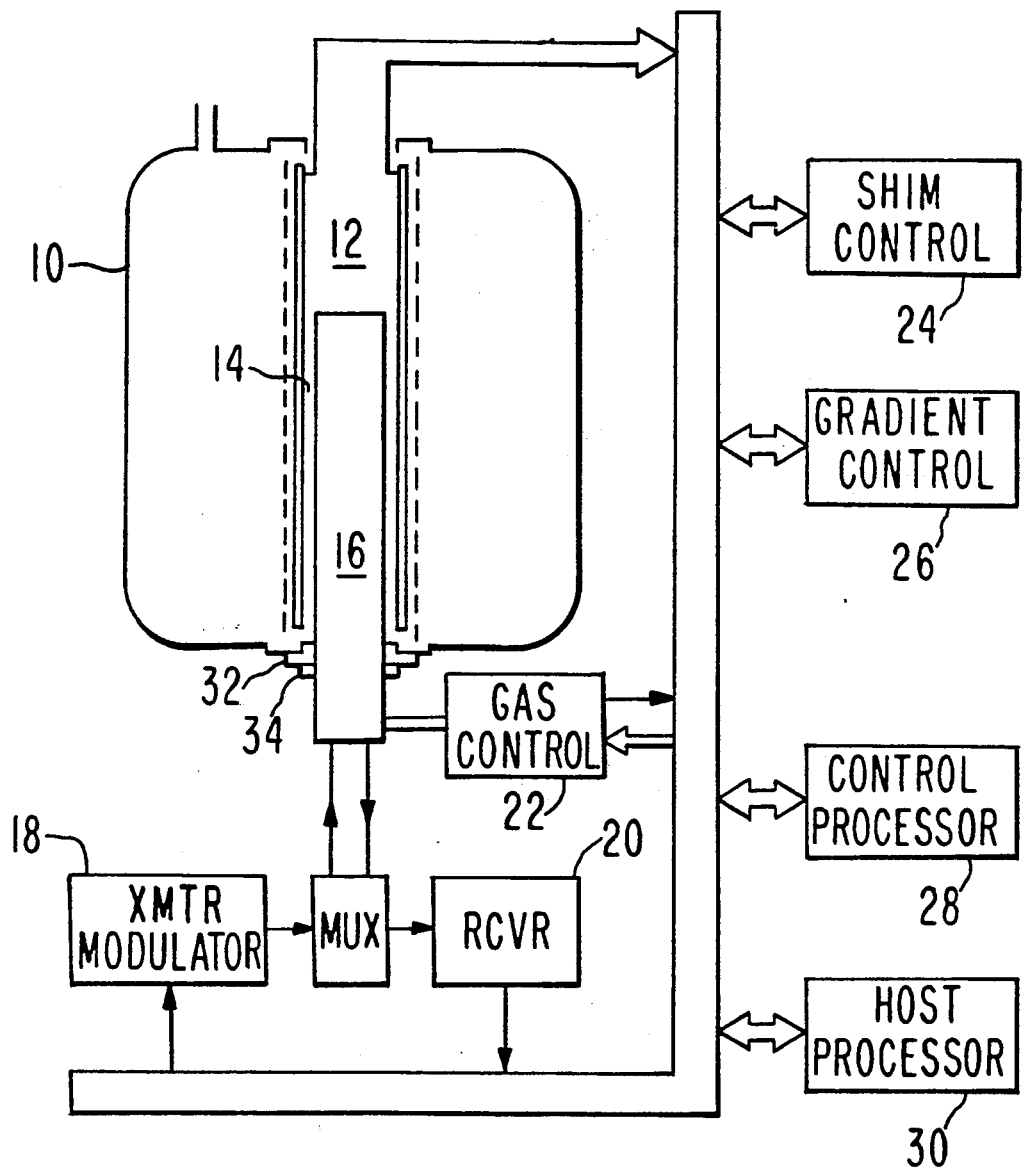
FIG. 1 is a schematic representation of the context of the invention.

Turning now to FIG. 1, a cryostat 10 houses a superconducting magnet (not shown) for maintaining a polarizing magnetic field in the bore 12 of the cryostat. The bore houses room temperature shim coils for correcting residual errors in the polarizing magnetic field and gradient coils for establishing desired controllable gradients of the magnetic field. Shim coils and gradient coils are represented schematically and collectively as coils 14 disposed in the (room temperature) periphery of bore 12. The probe housing 16 contains one or more tuned circuits for excitation of the sample (not shown) from one (or more) rf sources such as transmitter/modulator 18 and for coupling the resonant signal emitted from the sample through multiplexor 19 to the receiver 20. The probe may also contain apparatus for spinning the sample usually by pneumatic means and for maintaining desired thermal conditions. These are represented symbolically by gas controller 22. The shim and gradient coils 14 are respectively responsive to shim controller 24 and gradient controller 26. A control processor 28 manages the operation of the instrument and subsystems and host processor 30 manages interface activities originating with or directed to the user and the treatment, organization, display and interpretation of data.

The probe 16 may be subject to removal and reinsertion in bore 12 for a variety of reasons. In the present invention a flange 32 fixed to crystat 10 cooperates with a locking collar 34 affixed to the probe housing 16 to assure that the probe housing 16 occupies a precisely known location within bore 12 with a precisely selected orientation.

A preferred embodiment is shown in FIG. 2a and 2b wherein a flange 32 of circular symmetry includes a set of symmetric disposed radially directed holes 62. Flange 32 is secured to the magnet, coaxially with bore 12. In one arrangement of this form, the radial holes 62 are disposed 120° apart. Typically two of these holes are adapted to receive locating pins 64 and at least one of these pins is adapted to house a spring loaded plunger. Retractable spring loaded plungers of this form are commercial available, as for example from Vlier Enerpac.

The locking collar 34 (FIG. 2A) is adapted to be fixed in respect to an NMR probe housing 16. This can be accomplished via tangential lock bolt 68 and threads 69. The locking collar 34 includes a set of symmetrically placed detentes 70 with communicating bayonet receiving groove 74. The receiving groove 74 is preferably disposed on the periphery of collar 34 and comprises communicating portions axially oriented and azimuthal oriented.

The locating pins 64 and spring loaded plunger 65 are arranged to engage the symmetric detents 70. The pins 64 and plunger 65 are urged against the furthest axial portion of the respective axial grooves and then by rotation of the collar (locked to the probe body) the respective pins 64 and plunger 65 are urged against the terminal end of the azimuthal portion of the groove 74 providing positive azimuthal positioning.

For measurements which are directed to spatial distribution of resonant magnetic moments, the ability to selectably orient the probe structure about a relatively fixed sample provides for obtaining such information at diverse angular aspect. Where measurements are intended to integrate over spatial distribution, the ability to dispose the probe in selected azimuthal orientation about the polarizing field aids in minimizing the effect of the probe structure on its magnetic environment.

What is claimed is:

1. In an NMR apparatus for study of a sample,
   (a) Magnet means defining a sensitive magnetic field volume, the magnetic field in said volume having selected geometric symmetry properties,
   (b) NMR probe means for irradiating said sample and detecting magnetic resonance signals, said probe means adapted for insertion into said sensitive magnetic field volume,
   (c) Positive positioning means for reproducibly locating said probe means in respect to both a first coordinate substantially parallel to said magnetic field and a second coordinate substantially orthogonal to said magnetic field.

2. The apparatus of claim 1 wherein said selected geometric symmetry is cylindrical and said second coordinate is the azimuthal angle.

3. The apparatus of claim 2 wherein said sample is not rigidly supported from said NMR probe means.

4. The apparatus of claim 1 wherein positive positioning means comprises pin means associated with said probe means, said pin means extending in a plane containing said second coordinate, and stop means against which said pin means bears to positively define a locus of said second coordinate.

5. The apparatus of claim 4 wherein said stop means comprises detent means for receiving said pin means.

6. The apparatus of claim 4 wherein said probe means comprises a collar, said magnet means comprises a flange adapted to include said detent means.

* * * * *